United States Patent
Torimoto et al.

(10) Patent No.: US 10,233,389 B2
(45) Date of Patent: Mar. 19, 2019

(54) SEMICONDUCTOR NANOPARTICLES AND METHOD OF PRODUCING SEMICONDUCTOR NANOPARTICLES

(71) Applicants: NATIONAL UNIVERSITY CORPORATION NAGOYA UNIVERSITY, Nagoya-shi, Aichi-ken (JP); NICHIA CORPORATION, Anan-shi, Tokushima (JP)

(72) Inventors: Tsukasa Torimoto, Nagoya (JP); Tatsuya Kameyama, Nagoya (JP); Akihiro Fukatsu, Nagoya (JP); Daisuke Oyamatsu, Tokushima (JP)

(73) Assignees: NATIONAL UNIVERSITY CORPORATION NAGOYA UNIVERSITY, Nagoya-shi (JP); NICHIA CORPORATION, Anan-shi (JP)

(*) Notice: Subject to any disclaimer, the term of this patent is extended or adjusted under 35 U.S.C. 154(b) by 62 days.

(21) Appl. No.: 15/215,961

(22) Filed: Jul. 21, 2016

(65) Prior Publication Data
US 2017/0022413 A1     Jan. 26, 2017

(30) Foreign Application Priority Data
Jul. 22, 2015    (JP) ................... 2015-145103

(51) Int. Cl.
*H01L 29/06*    (2006.01)
*H01L 31/00*    (2006.01)
(Continued)

(52) U.S. Cl.
CPC .......... *C09K 11/621* (2013.01); *C01G 15/006* (2013.01); *H01L 33/502* (2013.01);
(Continued)

(58) Field of Classification Search
CPC ... C09K 11/621; C01G 15/006; H01L 33/502; H01L 33/504; B82Y 30/00; B82Y 40/00;
(Continued)

(56) References Cited

U.S. PATENT DOCUMENTS 8,569,102 B2 * 10/2013 Ahn ................ C01B 19/002
                                                      205/84
2007/0096128 A1    5/2007   Fukudome et al.
(Continued)

FOREIGN PATENT DOCUMENTS

JP    2007-146154 A    6/2007
JP    2007-169605 A    7/2007
(Continued)

OTHER PUBLICATIONS

Torimoto et al., "Remarkable photoluminescence enhancement of ZnS—AgInS2 solid solution nanoparticles by post-synthesis treatment." Chem. Commun., 2010, vol. 46, pp. 2082-2084. (Cited in Specification).

*Primary Examiner* — Ismail A Muse
(74) *Attorney, Agent, or Firm* — Hunton Andrews Kurth LLP

(57) ABSTRACT

A method of producing semiconductor nanoparticles is provided. The method includes heating primary semiconductor nanoparticles and a salt of an element $M^1$ in a solvent at a temperature set in a range of 100° C. to 300° C. The primary semiconductor nanoparticles contain the element $M^1$, an element $M^2$, optionally an element $M^3$, and an element Z, and have an average particle size of 50 nm or less. The element $M^1$ is at least one element selected from the group consisting of Ag, Cu, and Au. The element $M^2$ is at least one element selected from the group consisting of Al, Ga, In, and Tl. The element $M^3$ is at least one element selected from the group consisting of Zn and Cd. The
(Continued)

element Z is at least one element selected from the group consisting of S, Se, and Te.

19 Claims, 6 Drawing Sheets

(51) Int. Cl.
    *C09K 11/62*     (2006.01)
    *C01G 15/00*     (2006.01)
    *H01L 33/50*     (2010.01)
    *B82Y 40/00*     (2011.01)
    *B82Y 20/00*     (2011.01)
    *B82Y 30/00*     (2011.01)

(52) U.S. Cl.
    CPC .............. *B82Y 20/00* (2013.01); *B82Y 30/00* (2013.01); *B82Y 40/00* (2013.01); *C01P 2002/54* (2013.01); *C01P 2002/72* (2013.01); *C01P 2004/04* (2013.01); *C01P 2004/64* (2013.01); *C01P 2004/84* (2013.01); *H01L 33/504* (2013.01); *Y10S 977/773* (2013.01); *Y10S 977/813* (2013.01); *Y10S 977/896* (2013.01); *Y10S 977/95* (2013.01)

(58) Field of Classification Search
    CPC .. B82Y 20/00; C01P 2004/84; C01P 2004/04; C01P 2002/72; C01P 2002/54; C01P 2004/64; Y10S 977/813; Y10S 977/773; Y10S 977/95; Y10S 977/896
    See application file for complete search history.

(56) References Cited

U.S. PATENT DOCUMENTS

| | | |
|---|---|---|
| 2008/0029710 A1 | 2/2008 | Sekiya et al. |
| 2008/0272347 A1 | 11/2008 | Fukuda et al. |
| 2009/0159849 A1 | 6/2009 | Uehara et al. |
| 2009/0278094 A1 | 11/2009 | Torimoto et al. |
| 2010/0193806 A1 | 8/2010 | Byun |
| 2010/0295016 A1 | 11/2010 | Murase et al. |
| 2010/0317129 A1* | 12/2010 | Basol ................. C25D 5/10 438/16 |
| 2013/0045565 A1* | 2/2013 | Ahn ................. C01B 19/002 438/95 |
| 2013/0287703 A1 | 10/2013 | Jang et al. |
| 2014/0326949 A1* | 11/2014 | Xu ................. C09K 11/02 257/13 |
| 2015/0101665 A1* | 4/2015 | Liu ................. C09D 11/52 136/256 |
| 2015/0182936 A1* | 7/2015 | Kim ................. B01J 19/126 423/509 |
| 2016/0149091 A1* | 5/2016 | Kondo ................. C09K 11/02 257/13 |
| 2016/0281256 A1* | 9/2016 | Freer ................. B82Y 10/00 |
| 2016/0369975 A1* | 12/2016 | Chen ................. C09K 11/883 |
| 2017/0267924 A1* | 9/2017 | Kuwabata ............ C09K 11/621 |
| 2018/0158973 A1* | 6/2018 | Farshchi ............ H01L 31/0324 |
| 2018/0287006 A1* | 10/2018 | Liu ................. C09D 11/52 |

FOREIGN PATENT DOCUMENTS

| | | |
|---|---|---|
| JP | 2008-041361 A | 2/2008 |
| JP | 2009-057446 A | 3/2009 |
| JP | 2010-106119 A | 5/2010 |
| JP | 2010-177656 A | 8/2010 |
| JP | 2010-285600 A | 12/2010 |
| JP | 2012-212862 A | 11/2012 |
| JP | 2013-231175 A | 11/2013 |
| JP | 2015-189636 A | 11/2015 |
| WO | 2006-103908 A1 | 10/2006 |
| WO | 2007-026746 A1 | 3/2007 |
| WO | 2009-041168 A1 | 4/2009 |
| WO | 2014-129067 A1 | 8/2014 |

* cited by examiner

SEMICONDUCTOR NANOPARTICLES AND METHOD OF PRODUCING SEMICONDUCTOR NANOPARTICLES

CROSS REFERENCE TO RELATED APPLICATION

This application claims the benefit of Japanese Patent Application No. 2015-145103, filed on Jul. 22, 2015. The entire disclosure of Japanese Patent Application No. 2015-145103 is incorporated herein by reference.

BACKGROUND

Technical Field

The present disclosure relates to semiconductor nanoparticles, a method of producing semiconductor nanoparticles, and a light-emitting device and a liquid crystal display device using the semiconductor nanoparticles.

Description of Related Art

White light-emitting devices used as backlights of a liquid crystal display devices and the like, that utilize photoluminescence from quantum dots (also called "semiconductor quantum dots") have been proposed. Fine particles of semiconductor with a particle size of 10 nm or less, for example, are known to exhibit a quantum size effect. Such nanoparticles are called the quantum dots. The quantum size effect is a phenomenon where a valence band and a conduction band, each of which is regarded as continuous in bulk particles, become discrete when the particle size is on the nanoscale, whereby a bandgap energy changes depending on their particle size.

The quantum dots absorb light and emit light corresponding to the bandgap energy. Thus, the quantum dots can be used as a wavelength conversion material in the light-emitting devices. For example, Japanese Unexamined Patent Application Publication No. 2012-212862 and Japanese Unexamined Patent Application Publication No. 2010-177656 have proposed the light-emitting devices using the quantum dots. More specifically, part of light emitted from a light-emitting diode (LED) chip is absorbed by the quantum dots, which emit light of another color. The light emitted from the quantum dots and the light from the LED chip not absorbed by the quantum dots are mixed to produce white light. These patent documents have proposed the use of quantum dots made of group II-VI compounds such as CdSe and CdTe, or group IV-VI compounds such as PbS and PbSe. WO 2014/129067 has proposed a wavelength conversion film utilizing core-shell structured semiconductor quantum dots that are designed not to contain Cd or Pb, by taking into consideration the toxicity of compounds containing these elements. The formation of such a core-shell structure is also mentioned in non-patent document of Chem, Commun. 2010, vol. 46, pp. 2082-2084.

One of the advantages of using the quantum dots in the light-emitting devices is that the light with a wavelength corresponding to a bandgap can have a peak with a relatively narrow full width at half maximum. However, among the quantum dots proposed as the wavelength conversion material, only quantum dots made of a binary semiconductor, typified by a group II-VI semiconductor such as CdSe, can be confirmed to emit the light with the wavelength corresponding to the bandgap, that is, to achieve band-edge emission. Meanwhile, ternary quantum dots, especially, group I-III-VI quantum dots have not been confirmed to exhibit the band-edge emission.

The light emitted from the group I-III-VI quantum dots is caused by the defect levels of the surface or inside of the particles, or by the donor-acceptor-pair recombination, and thus has a broad emission peak with a wide full width at half maximum and a long photoluminescence lifetime. Such light emission is not appropriate for light-emitting devices, particularly, one that is used in the liquid crystal display device. This is because the light-emitting device used in the liquid crystal display device is required to emit light with a narrow full width at half maximum that has a peak wavelength corresponding to each of three primary colors (i.e., RGB) in order to ensure the high color reproducibility. For this reason, practical use of the ternary quantum dots has not been prompted despite its less toxic composition.

SUMMARY

Therefore, one object of certain embodiments of the disclosure is to provide sulfide-based, selenide-based, or telluride-based semiconductor nanoparticles that contain specific elements, as ternary (or quaternary) quantum dots which can be of a less toxic composition and achieve the band-edge emission, as well as to provide a production method therefor.

According to certain embodiments of disclosure, semiconductor nanoparticles are provided. The semiconductor nanoparticles include an element $M^1$, an element $M^2$, and an element Z, and have an average particle size of 50 nm or less. The element $M^1$ is at least one element selected from the group consisting of Ag, Cu, and Au. The element $M^2$ is at least one element selected from the group consisting of Al, Ga, In, and Tl. The element Z is at least one element selected from the group consisting of S, Se, and Te. A ratio ($M^1/M^2$) of the number of atoms of the element $M^1$ to the number of atoms of the element $M^2$ is 0.990 or greater and 1.089 or less. When irradiated with light at a wavelength in a range of 350 to 1,000 nm, the semiconductor nanoparticles emit photoluminescence that has a photoluminescence lifetime of 200 ns or less.

According to certain embodiments of the disclosure, a method of producing semiconductor nanoparticles includes heating primary semiconductor nanoparticles and a salt of an element $M^1$ in a solvent at a temperature set in a range of 100° C. to 300° C., in which the primary nanoparticles contain the element $M^1$, an element $M^2$, and an element Z, and have an average particle size of 50 nm or less. The element $M^1$ is at least one element selected from the group consisting of Ag, Cu, and Au. The element $M^2$ is at least one element selected from the group consisting of Al, Ga, In, and Tl. The element Z is at least one element selected from the group consisting of S, Se, and Te.

Further, according to certain embodiments of the disclosure, a method of producing semiconductor nanoparticles includes heating primary semiconductor nanoparticles and a salt of an element $M^2$ in a solvent at a temperature set in a range of 100° C. to 300° C., in which the primary nanoparticles contain an element $M^1$, the element $M^2$, and an element Z, and have an average particle size of 50 nm or less. The element $M^1$ is at least one element selected from the group consisting of Ag, Cu, and Au. The element $M^2$ is at least one element selected from the group consisting of Al, Ga, In, and Tl. The element Z is at least one element selected from the group consisting of S, Se, and Te.

The semiconductor nanoparticles described above contain specific elements in which a ratio ($M^1/M^2$) of the numbers of atoms of two metal elements ($M^1$ and $M^2$) is 0.990 or greater and 1.089 or less. This condition allows achievement of emission of short photoluminescence lifetime, i.e., band-edge emission, which could not be obtained in conventional ternary quantum dots. Furthermore, the semiconductor nanoparticles can have a composition that does not contain highly toxic elements such as Cd and Pb, and can be applied to products and the like in which the use of Cd and the like is prohibited. Therefore, the semiconductor nanoparticles can be suitable for use as a wavelength conversion material of the light emitting emission device used in the liquid crystal display device or as a biomolecular marker.

Moreover, with the method of producing the semiconductor nanoparticles described above, ternary or quaternary semiconductor nanoparticles that can produce band-edge emission can be produced with relative ease.

DETAILED DESCRIPTION

Figure 1:
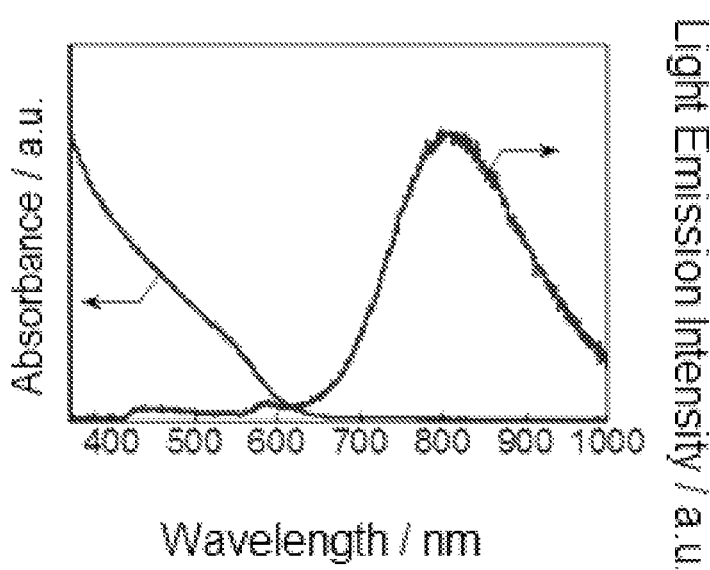
FIG. 1 shows absorption and emission spectra of Sample 1-1 obtained in Experiment 1.

Certain embodiments of the present disclosure will be described in detail below. Note that the present disclosure is not intended to be limited by the following embodiments. Matters mentioned in the respective embodiments and their modified examples can be applied to other embodiments and modified examples unless otherwise specified.

First Embodiment

Ternary Semiconductor Nanoparticles

As a first embodiment, ternary semiconductor nanoparticles will be described below.

The semiconductor nanoparticles of the first embodiment contain elements $M^1$, $M^2$, and Z, and have an average particle size of 50 nm or less. Here, the element $M^1$ is at least one element selected from the group consisting of Ag, Cu, and Au, preferably Ag or Cu, and particularly preferably Ag. When $M^1$ is Ag, the semiconductor nanoparticles can be easily synthesized. Two or more elements may be contained as the element $M^1$. The crystal structure of the semiconductor nanoparticles may be at least one selected from the group consisting of a tetragonal system, a hexagonal system, and an orthorhombic system.

The element $M^2$ is at least one element selected from the group consisting of Al, Ga, In, and Tl, preferably In or Ga, and particularly preferably In. In is preferable because it is less likely to generate a by-product. Two or more elements may be contained as the element $M^2$.

The element Z is at least one element selected from the group consisting of S, Se, and Te, and preferably S. The semiconductor nanoparticles containing S as the element Z have a wider bandgap, compared to nanoparticles containing Se or Te as the element Z. Thus, the semiconductor nanoparticles containing S is preferable because they are more likely to exhibit the emission in the visible light range. Two or more elements may be contained as the element Z.

The combinations of $M^1$, $M^2$, and Z can be appropriately set. The combinations of $M^1$, $M^2$, and Z (typical notation is: $M^1/M^2/Z$) preferably include Cu/In/S, Ag/In/S, Ag/In/Se, and Ag/Ga/S.

The semiconductor nanoparticles containing the specific elements shown above and having the crystal structure of the tetragonal system, hexagonal system, or orthorhombic system are generally represented by the composition formula of $M^1M^2Z_2$, as indicated by the literature and the like. One of the semiconductors represented by the composition formula of $M^1M^2Z_2$ and having the hexagonal system is of the wurtzite type, whereas another having the tetragonal system is of the chalcopyrite type. The crystal structure is identified, for example, by measuring an X-ray diffraction (XRD) pattern obtained by XRD. More specifically, an XRD pattern obtained from the semiconductor nanoparticles is compared with a known XRD pattern of semiconductor nanoparticles having one composition of $M^1M^2Z_2$, or an XRD pattern determined by simulation from crystal structure parameters. If the known pattern or simulated pattern is identical to the pattern of the semiconductor nanoparticles of this embodiment, such semiconductor nanoparticles is said to have the same crystal structure as that of the nanoparticles with the known pattern or with the simulated pattern.

An aggregate of the nanoparticles may be a mixture of nanoparticles with different crystal structures. In that case, the XRD pattern is observed to have peaks derived from a plurality of crystal structures.

Even when setting the preparation ratio of raw material to the stoichiometric ratio, the inventors have confirmed that semiconductor nanoparticles actually obtained are not represented by the stoichiometric composition formula, but are present as a non-stoichiometric composition. More specifically, for example, a $M^1$ salt, a $M^2$ salt, and a ligand with a Z element as a coordination element (that is, a chelator) are mixed to give a complex, which is heated into a heat-treated substance. The heat-treated substance is further heated with alkylamine or alkenylamine to produce semiconductor nanoparticles. In this case, it is confirmed that the complex has a composition relatively close to the stoichiometic composition, but after the heating, the heat-treated substance has a composition significantly deviating from the stoichiometric composition. Especially, regarding $M^1$-$M^2$-Z based semiconductor nanoparticles, the number of atoms in $M^1$ of the actually-obtained nanoparticles is smaller, and the ratio of the number of atoms of $M^1$ to that of $M^2$ (i.e., $M^1/M^2$) is smaller than 1, for example, 0.500 or greater and less than 0.990.

For this reason, the inventors have studied methods for attaining a composition close to the stoichiometric composition in the semiconductor nanoparticles of which actual composition is non-stoichiometric. Accordingly, the inventors have found that according to a method to be described below as a fourth embodiment, semiconductor nanoparticles having a composition in which the ratio ($M^1/M^2$) of the number of atoms of $M^1$ to the number of atoms of $M^2$ is close to 1 can be obtained, and further, the semiconductor nanoparticles can produce band-edge emission.

In this embodiment, the ratio ($M^1/M^2$) of the number of atoms of $M^1$ to the number of atoms $M^2$ is 0.990 or greater and 1.089 or less. When the ratio of $M^1/M^2$ is less than 0.990, or exceeds 1.089, the semiconductor nanoparticles are less likely to produce the band-edge emission.

The chemical composition of the semiconductor nanoparticles can be identified, for example, by fluorescent X-ray analysis (XRF). The ratio of $M^1/M^2$ can be calculated based on the chemical composition measured by this method.

The nanoparticles of the first embodiment are substantially comprised of the elements $M^1$, $M^2$, and Z only. The term "substantially" as used herein is used in view of possible presence of one or greater elements other than the elements $M^1$, $M^2$, and Z that may be unintentionally mixed in as impurities or the like.

For example, part of $M^2$ may be substituted with other metal elements. Other metal elements can be those which form trivalent metal ions, more specifically, can be one or more elements selected from Cr, Fe, Al, Y, Sc, La, V, Mn, Co, Ni, Ga, In, Rh, Ru, Mo, Nb, W, Bi, As, and Sb. The substitution rate of the substitution element is preferably 10% or less when the total number of atoms contained in $M^2$ and the substitution element is set to 100%.

The semiconductor nanoparticles of this embodiment have an average particle size of 50 nm or less. The average particle size may be, for example, in a range of 1 nm to 20 nm, and particularly in a range of 1 nm to 10 nm. The semiconductor nanoparticles with an average particle size exceeding 50 nm are less likely to exhibit the quantum size effect, making it difficult to obtain the band-edge emission.

The average particle size of the nanoparticles may be determined, for example, from a transmission electron microscope (TEM) image taken by the use of a TEM. More specifically, the particle size means the longest one of line segments each of which is formed by connecting any two points on the outer periphery of a single particle observed on a TEM image and passes through the center of the particle.

When the particle has a rod shape, the particle size is defined as the length of the short axis. In the present specification, "rod-shaped" particles are observed to have shapes such as quadrangular shapes inclusive of rectangular shapes (with a cross section of a circular shape, an elliptical shape, or a polygonal shape), elliptical shapes, and polygonal shapes (for example, a pencil-like shape), with each particle having a ratio of the long axis to the short axis of more than 1.2. As referred to above, of "rod-shaped" particles having elliptical shapes, "long axis" indicates a length of a longest one of line segments each formed by connecting any two points on the outer periphery of each particle. Also, in the case of "rod-shaped" particles having quadrangular or polygonal shapes, "long axis" indicates a length of a longest one of line segments that are in parallel with a longest side of the sides that form outer periphery of each particle and formed by connecting two points on the outer periphery of the particle. Meanwhile, "short axis" indicates a length of a longest one of line segments that are perpendicular to the line segment that defines the long axis and formed by connecting two points on the outer periphery of the particle.

The average particle size is an arithmetic average of the particle sizes determined by taking TEM images at a magnification of 50,000× to 150,000×, and measuring and averaging the lengths of all the measurable nanoparticles observed on the TEM images. Here, the "measurable" particle indicates a particle, the whole of which can be observed on the TEM image. Thus, on the TEM image, a particle "cut" or missing its part in an image range, such as a particle of which part is "cut", is not "measurable" one.

When one TEM image contains 100 or greater nanoparticles in total, the average particle size of the nanoparticles is determined by using this TEM image. When one TEM image contains only a smaller number of nanoparticles, more TEM images are taken by changing sites for imaging, and 100 or greater nanoparticles in total contained in two or more TEM images are then observed to measure the particle size of the nanoparticles.

Assuming that each of the semiconductor nanoparticles of the first embodiment is divided into an inner shell and an outer shell that have the equal volume, the number of atoms of $M^1$ or $M^2$ contained in the outer shell may be larger than that of $M^1$ or $M^2$ contained in the inner shell. In producing the semiconductor nanoparticles by the method mentioned later, when $M^1$ or $M^2$ is doped later from the surface of the semiconductor nanoparticles thereinto, the concentration of the doped element becomes higher closer to the surface.

In cutting the semiconductor nanoparticle along its outer peripheral surface such that the volume of a cut part is equal to that of the remaining part, the cut part corresponds to an outer shell that equally divides the nanoparticle in terms of volume, whereas the remaining part corresponds to the inner shell that equally divides the nanoparticle. The outer peripheral surface of the remaining part becomes a boundary between the outer shell and the inner shell. Whether or not the number of atoms of $M^1$ contained in the outer shell is larger than that of $M^1$ contained in the inner shell or whether or not the number of atoms of $M^2$ contained in the outer shell is larger than that of $M^2$ contained in the inner shell can be known by mapping $M^1$ or $M^2$, for example, by using either an energy diffusion X-ray spectrometer (EDX) or an electron energy-loss spectrometer (EELS) attached to an ultra-high resolution transmission electron microscope. In the mapping, an area containing a larger amount of a predetermined element is shown in a darker color, while an area containing a smaller amount of the predetermined element is shown in a lighter color. Therefore, for example, if the number of atoms of $M^1$ contained in the outer shell is larger than that of $M^1$ contained in the inner shell, in the mapping of $M^1$, an area close to the outer periphery of the particle is shown in the darker color, whereas the inner side area thereof is shown in the lighter color.

The semiconductor nanoparticles of this embodiment can produce the band-edge emission because the ratio of $M^1/M^2$ is within the above-mentioned range. More specifically, when irradiated with light at a wavelength in a range of 350 nm to 1,000 nm, the semiconductor nanoparticles in this embodiment can emit photoluminescence that has a wavelength longer than the irradiation light as well as a photoluminescence lifetime of 200 ns or less. The fluorescence having the photoluminescence lifetime of 200 nm or less is preferably observed to have a full width at half maximum of 150 nm or less in an emission spectrum of the semiconductor nanoparticles. The reason why the semiconductor nanoparticles of the embodiment can provide the band-edge emission is not clear, but it is supposed that, due to the fact that the $M^1/M^2$ ratio of the semiconductor nanoparticles of this embodiment is larger compared to that of the nanoparticles obtained by the conventional method, the element $M^1$ can cover defects in the crystals, reducing the defect level, thereby eliminating the defective emission.

In the present specification, the term "photoluminescence" includes fluorescence.

Figure 2:
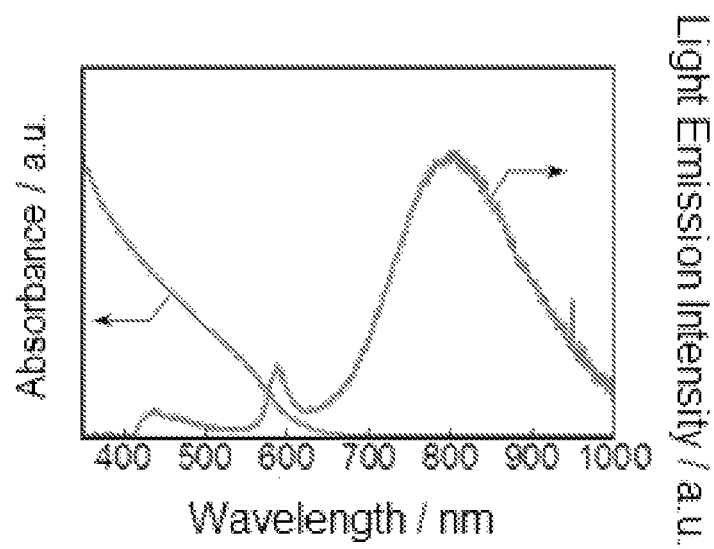
FIG. 2 shows absorption and emission spectra of Sample 1-2 obtained in Experiment 1.
Figure 3:
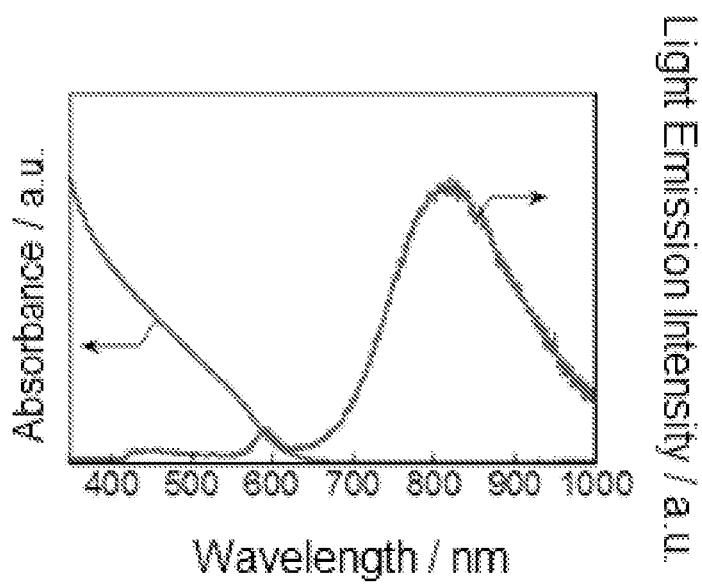
FIG. 3 shows absorption and emission spectra of Sample 1-3 obtained in Experiment 1.
Figure 4:
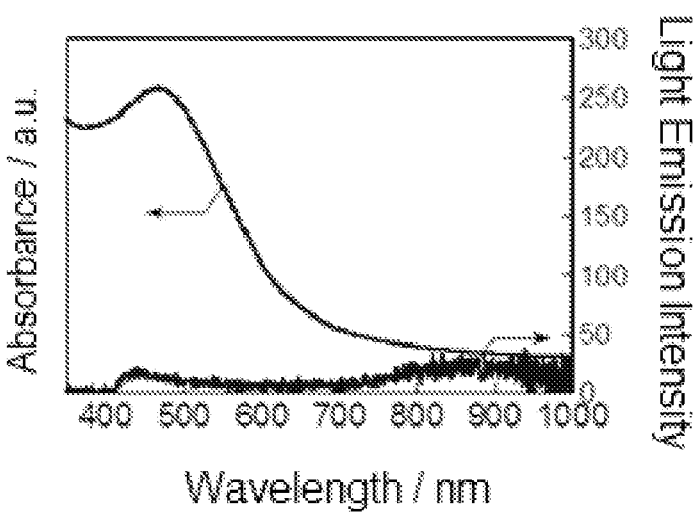
FIG. 4 shows absorption and emission spectra of Sample 1-4 obtained in Experiment 1.

The emission spectrum of the semiconductor nanoparticles in this embodiment is obtained by irradiating the nanoparticles with the light having a wavelength in a range of 350 nm to 1100 nm. For example, when light having a wavelength of 365 nm is applied to the nanoparticles which have a tetragonal crystal structure containing Ag, In, and S as $M^1$, $M^2$, and Z, respectively, with the $M^1/M^2$ ratio of 0.990, the emission spectrum can be obtained to have an emission peak derived from the band-edge emission at a wavelength of around 588 nm as shown in FIG. 2.

The band-edge emission from the semiconductor nanoparticles of this embodiment can change its peak position by adjusting the shape and/or particle size, especially the particle size of each semiconductor nanoparticles. For example, by decreasing the particle size of the semiconductor nanoparticles, the bandgap energy becomes larger by the quantum size effect, so that the peak wavelength of the band-edge emission can be shifted toward a shorter wavelength side.

The absorption spectrum of the semiconductor nanoparticles according to this embodiment is obtained by irradiation with the light of wavelengths selected from a predetermined range. For example, when light of wavelengths in a range of 250 nm to 1,000 nm is applied to the nanoparticles which contain Ag, In, and S as $M^1$, $M^2$, and Z, respectively, with the $M^1/M^2$ ratio of 0.990, the absorption spectrum can be obtained as shown in FIG. 2.

The semiconductor nanoparticles of this embodiment preferably give the absorption spectrum exhibiting an exciton peak. The exciton peak is a peak obtained by formation of an exciton. The exhibition of this peak in the absorption spectrum means that the semiconductor nanoparticles have the small distribution of particle sizes and few crystal defects, being suitable for the band-edge emission. It also means that as the exciton peak becomes sharper, the aggregate of semiconductor nanoparticles contains a greater amount of particles having uniform particle size with less crystal defects, and hence the full width at half maximum of the light emission from the nanoparticles is supposed to become narrower, thereby improving the luminous efficiency. In the absorption spectrum of the semiconductor nanoparticles of this embodiment, the exciton peak is observed, for example, in a range of 350 nm to 1,000 nm.

The semiconductor nanoparticles of this embodiment may have their surfaces modified by any compound. Generally, a compound that modifies surfaces of nanoparticles is called a "surface modifier". The surface modifier is, for example, to prevent agglomeration and further growth of the nanoparticles by stabilizing the nanoparticles, and/or to improve the dispersibility of the nanoparticles in a corresponding solvent.

In this embodiment, examples of the surface modifier may include a nitrogen-containing compound having a hydrocarbon group with 4 to 20 carbon atoms, a sulfur-containing compound having a hydrocarbon group with 4 to 20 carbon atoms, and an oxygen-containing compound having a hydrocarbon group with 4 to 20 carbon atoms. Examples of the hydrocarbon group with 4 to 20 carbon atoms can include saturated aliphatic hydrocarbon groups such as an n-butyl group, an isobutyl group, an n-pentyle group, an n-hexyl group, an octyl group, a decyl group, a dodecyl group, a hexadecyl group, and an octadecyl group; unsaturated aliphatic hydrocarbon groups such as an oleyl group; alicyclic hydrocarbon groups such as a cyclopentyl group and a cyclohexyl group; and aromatic hydrocarbon groups such as a phenyl group, a benzyl group, a naphthyl group, and a naphthylmethyl group. Among them, the saturated aliphatic hydrocarbon groups and the unsaturated aliphatic hydrocarbon groups are preferable. Examples of the nitrogen-containing compound can include amines and amides; examples of the sulfur-containing compound can include thiols; and examples of the oxygen-containing compound can include fatty acids.

The surface modifier is preferably a nitrogen-containing compound having a hydrocarbon group with 4 to 20 carbon atoms. Such nitrogen-containing compounds include, for example, alkylamines such as n-butylamine, isobutylamine, n-pentylamine, n-hexylamine, octylamine, decylamine, dodecylamine, hexadecylamine and octadecylamine, and alkenylamines such as oleylamine.

The surface modifier is preferably a sulfur-containing compound having a hydrocarbon group with 4 to 20 carbon atoms. Such sulfur-containing compounds include, for example, n-butanethiol, isobutanethiol, n-pentanethiol, n-hexanethiol, octanethiol, decanethiol, dodecanethiol, hexadecanethiol, and octadecanethiol.

The surface modifier in use may be a combination of two or more different surface modifiers. For example, one compound (e.g., oleylamine) selected from the nitrogen-containing compounds exemplified above, and one compound (e.g., dodecanethiol) selected from the sulfur-containing compounds exemplified above may be combined and used.

Second Embodiment

Quaternary Semiconductor Nanoparticles

As a second embodiment, quaternary semiconductor nanoparticles will be described below.

The semiconductor nanoparticles of the second embodiment contain $M^1$, $M^2$, $M^3$, and Z, and have an average particle size of 50 nm or less. The crystal structure of the semiconductor nanoparticles may be at least one selected from the group consisting of a tetragonal system, a hexagonal system, and an orthorhombic system. An aggregate of the nanoparticles may be a mixture of nanoparticles with different crystal structures. In that case, the XRD pattern is observed to have peaks derived from a plurality of crystal structures.

$M^1$, $M^2$, and Z have been described above in relation to the first embodiment. Here, their description will be omitted.

$M^3$ is at least one element selected from the group consisting of Zn and Cd. $M^3$ is preferably Zn. When $M^3$ is Zn, this embodiment can provide the semiconductor nanoparticles with a less toxic composition.

The combinations of $M^1$, $M^2$, $M^3$, and Z (typical notation is: $M^1/M^2/M^3/Z$) are not more specifically limited. The combinations of $M^1$, $M^2$, $M^3$, and Z (typical notation is: $M^1/M^2/M^3/Z$) are preferably Cu/In/Zn/S, and Ag/In/Zn/S.

The semiconductor nanoparticles containing the above specified four kinds of elements and having the crystal structure of the tetragonal system, hexagonal system, or orthorhombic system are generally represented by the composition formula of $(M^1M^2)_x M^3_y Z_2$ (where x+y=2), as indicated by the literature and the like. That is, it can be said that the semiconductor nanoparticles represented by this composition formula are ones, in which $M^3$ is doped into the semiconductor nanoparticles represented by the composition formula of $M^1M^2Z_2$ described in relation to the first embodiment, or ones in which $M^1M^2Z_2$ and $M^3Z$ form a solid solution. The inventors have confirmed that in reality the semiconductor nanoparticles represented by general formula $(M^1M^2)_x M^3_y Z_2$ do not have the stoichiometric composition and that particularly, the ratio $(M^1/M^2)$ of the number of atoms of $M^1$ to that of $M^2$ is smaller than 1. Further, the inventors have found that the quaternary semiconductor nanoparticles in which $M^1/M^2$ is increased according to the production method to be mentioned later can also produce the band-edge emission.

An identification method of the crystal structure of the semiconductor nanoparticles in the second embodiment will be the same as that explained in relation to the first embodiment.

Also, in this embodiment, the ratio ($M^1/M^2$) of the number of atoms $M^1$ to the number of atoms $M^2$ is 0.990 or greater and 1.089 or less. When the ratio of $M^1/M^2$ is less than 0.990, or exceeds 1.089, the semiconductor nanoparticles are less likely to produce the band-edge emission. The way to determine the $M^1/M^2$ ratio has been described in relation to the first embodiment.

The nanoparticles of the second embodiment are substantially comprised of the elements $M^1$, $M^2$, $M^3$, and Z only. The term "substantially" as used herein is used in view of possible presence of one or greater elements other than the elements $M^1$, $M^2$, $M^3$ and Z that may be unintentionally mixed in as impurities or the like. Alternatively, the nanoparticles of the second embodiment may contain other elements as long as the ratio of $M^1/M^2$ is in the range described above.

For example, part of $M^2$ may be substituted with other metal elements. Examples of other metal elements and their substitution rate have been described above in relation to the first embodiment. Thus, their description will be omitted.

Additionally or alternatively, part of $M^3$ may be substituted with other metal elements. Other metal elements can be those which form divalent metal ions, more specifically, can be at least one element selected from Co, Ni, Pd, Sr, Ba, Fe, Cr, Mn, Cu, Cd, Rh, W, Ru, Pb, Sn, Mg, and Ca. The substitution rate is preferably 10% or less when the total number of atoms contained in $M^3$ and the substitution element is set at 100%.

The semiconductor nanoparticles of present embodiment have an average particle size of 50 nm or less as in the first embodiment. The average particle size may preferably be, for example, in a range of 1 nm to 20 nm, and particularly 1 nm to 10 nm. The semiconductor nanoparticles with an average particle size exceeding 50 nm are less likely to exhibit quantum size effect, making it difficult to produce the band-edge emission. The ways to determine the average particle size are the same as those described above in relation to the first embodiment. Thus, their description will be omitted.

In the nanoparticles of this embodiment, when equally dividing the nanoparticle into the inner shell and the outer shell in terms of the volume, the number of atoms of $M^1$ or $M^2$ contained in the outer shell may be larger than that of $M^1$ or $M^2$ contained in the inner shell, as in the first embodiment. The meaning of the term "dividing the nanoparticle into the inner shell and outer shell in terms of volume" has been described in relation to the first embodiment, and here its explanation will be omitted.

The semiconductor nanoparticles of this embodiment can produce the band-edge emission because the ratio of $M^1/M^2$ is in the above-mentioned range. Furthermore, the absorption spectrum of the semiconductor nanoparticles of this embodiment preferably exhibits an exciton peak.

In the second embodiment, the doping of $M^3$ makes the peak wavelength or the like of the band-edge emission different from that in the first embodiment. Thus, the peak wavelength of the band-edge emission can be adjusted by selecting the kind and doping amount of $M^3$.

The emission and absorption properties of the semiconductor nanoparticles of the second embodiment are the same as those of the first embodiment, and here their detailed description will be omitted.

The semiconductor nanoparticles of this embodiment may also have their surfaces modified by any compound. Examples of the surface modifier are the same as those described above in relation to the first embodiment, and here their detailed description will be omitted.

Third Embodiment

Semiconductor Nanoparticles with Coating Layer

The semiconductor nanoparticles of the first and second embodiments may be coated with one or more coating layers. The semiconductor nanoparticles coated with the coating layer has the so-called core-shell structure, and are also called "core-shell structured nanoparticles". The coating layer may be represented by general formula of $M^{3'}Z'$ (where $M^{3'}$ is at least one element selected from the group consisting of Zn and Cd, and $Z'$ is at least one element selected from the group consisting of S, Se, and Te). Even if the core-shell structured particles agglomerate, cores of the adjacent particles are separated from each other by their shells, whereby the cores themselves are not agglomerated. Thus, the semiconductor nanoparticles having the cores can sufficiently exhibit their functions (e.g., wavelength conversion function).

In the core-shell structured nanoparticles, defective surface sites are covered by the coating layer, which tends to strengthen the band-edge emission.

Examples of a compound forming the coating layer include ZnS, CdS, ZnSe, CdSe, CdTe, ZnTe, and cadmium zinc telluride. It is generally effective to create an energy barrier by using a semiconductor having a composition with a larger bandgap than that of a semiconductor nanoparticle to form the coating layer. Among these compounds, ZnS is preferably used because it is less toxic than a compound containing Cd and has been actually used in the coating layer for nanoparticles. A plurality of the coating layers may be formed, that is, the coating layer may have a multi-layered structure, on the surface of the semiconductor nanoparticles. In this case, the compound for forming each layer of the multi-layered structure is preferably selected such that especially a refractive index of a lower part (part closer to the core) of the multi-layered structure is higher than that of an upper part (part closer to the surface of the core-shell structured nanoparticles) of the multi-layered structure. The outermost part of the coating layer may be further coated with a metal compound to protect the semiconductor nanoparticles from surrounding environment.

In the case where the semiconductor nanoparticles are covered with the coating layer, they become considerably larger as a whole than the nanoparticles before covered with the coating layer. However, since the core part of the nanoparticle ensures the light emission, the increase in particle size of the nanoparticle due to the presence of the coating layer does not affect the light emission. The average particle size of the semiconductor nanoparticles coated with the coating layer is preferably 100 nm or less. When the average particle size exceeds 100 nm, the dispersion stability of the nanoparticles into an organic solvent deteriorates. The ways to determine the particle size and average particle size are the same as those described above in relation to the first embodiment. Here, their detailed description will be omitted.

Fourth Embodiment

Method for Producing Semiconductor Nanoparticles

Next, as a fourth embodiment, a method of producing the semiconductor nanoparticles of the first and second embodiments will be described. The production method of this embodiment includes preparing semiconductor nanoparticles (primary semiconductor nanoparticles), or producing semiconductor nanoparticles (primary semiconductor nanoparticles) by an arbitrary method, and sequentially subjecting the primary semiconductor nanoparticles to the treatment described below. This treatment changes the ratio ($M^1/M^2$) of the number of atoms of the element $M^1$ to the number of atoms of the element $M^2$ in the primary semiconductor nanoparticles, thereby making it possible to produce the semiconductor nanoparticles with a different $M^1/M^2$ ratio from that of the primary semiconductor nanoparticles. That is, in the production method according to the present embodiment, either $M^1$ or $M^2$ that has a smaller ratio in the primary semiconductor nanoparticles when compared to the respective stoichiometric ratios is doped in the semiconductor nanoparticles afterward.

More specifically, the method of this embodiment includes heating the primary semiconductor nanoparticles and a salt of the element $M^1$ in a solvent at a temperature set in a range of 100° C. to 300° C. This heating process changes, for example, the ratio ($M^1/M^2$) of the number of atoms of $M^1$ to the number of atoms of $M^2$ in the primary semiconductor nanoparticles to produce the semiconductor nanoparticles with the $M^1/M^2$ ratio different from that of the primary semiconductor nanoparticles. When heating the primary semiconductor nanoparticles together with the salt of the element $M^1$ in the solvent, the $M^1/M^2$ ratio can be increased. As long as the $M^1/M^2$ ratio can be changed (for example, increased) to a desired value, other metal salts, for example, a salt of the element $M^2$ may be contained in the solvent during the heating. When producing the semiconductor nanoparticles of the second embodiment, for example, a salt of the element $M^3$ may be contained in the solvent.

Alternatively, in this embodiment, the primary semiconductor nanoparticles and a salt of the element $M^2$ are heated in the solvent at a temperature set in a range of 100° C. to 300° C. This heating process changes, for example, the ratio ($M^1/M^2$) of the number of atoms of $M^1$ to the number of atoms of $M^2$ in the primary semiconductor nanoparticles to produce the semiconductor nanoparticles with the $M^1/M^2$ ratio different from that of the primary semiconductor nanoparticles. When heating the primary semiconductor nanoparticles with the salt of the element $M^2$ in the solvent, the $M^1/M^2$ ratio can be reduced. As long as the $M^1/M^2$ ratio can be changed (for example, decreased) to a desired value, other metal salts, for example, a salt of the element $M^1$ may be contained in the solvent during the heating. When producing the semiconductor nanoparticles of the second embodiment, for example, a salt of the element $M^3$ may be contained in the solvent.

The kind of salt for use in doping is not more specifically limited, and may be either an organic acid salt or an inorganic acid salt. More specifically, the salts may be any one of a nitrate, an acetate, a sulfate, a hydrochloride, and a sulfonate. In this embodiment, the salt for use in doping is preferably the organic acid salt such as acetate. The organic acid salt has high solubility in an organic solvent, and tends to uniformly progress the reaction.

In general, in the primary semiconductor nanoparticles (i.e., semiconductor nanoparticles before the doping), the difference from the stoichiometric ratio is more significant for the ratio of the element $M^1$ (e.g., Ag in the semiconductor nanoparticles having the tetragonal, hexagonal, or orthorhombic system and containing Ag, In, and/or S). In other words, the ratio of the element $M^1$ tends to be smaller than the element $M^2$, when being compared to the stoichiometric ratio. Therefore, in this embodiment, for example, the $M^1$ salt may be used to increase the ratio ($M^1/M^2$) of the number of atoms of $M^1$ to the number of atoms of $M^2$ in the primary semiconductor nanoparticles. It is apparent that, when compared to the stoichiometric ratio, the difference from the stoichiometric ratio is more significant for the ratio of the element $M^2$, and the $M^2$ salt may be used to decrease the $M^1/M^2$ ratio.

The primary semiconductor nanoparticles and a salt of a doping element are heated in the solvent. Here, the solvent may be the surface modifier or a solution containing the surface modifier. The use of such a solvent finally gives the semiconductor nanoparticles modified by the surface modifier. For example, an amine having a hydrocarbon group with 4 to 20 carbon atoms, and a thiol having a hydrocarbon group with 4 to 20 carbon atoms function as the surface modifier as mentioned above. They are present in the form of liquid under a temperature of 100° C. to 300° C., and hence are preferably used as the solvent also serving as the surface modifier in this embodiment. One kind of solvent also serving as the surface modifier may be used, or alternatively, a plurality of kinds of solvents may be combined for use. For example, the amine having a hydrocarbon group with 4 to 20 carbon atoms and the thiol having a hydrocarbon group with 4 to 20 carbon atoms may be combined for use.

Alternatively, the surface modifier may be dissolved or dispersed in the solvent that does not function as the surface modifier, to perform doping. More specifically, hexadecylamine as the surface modifier may be dissolved in octadecene as the solvent. Alternatively, a mixture of a solvent that functions as the surface modifier and a solvent that functions as the surface modifier may be used in this embodiment.

Heating is performed at a temperature of 100° C. to 300° C. When the heating temperature is lower than 100° C., the doping may be less likely to progress, making it difficult to change the $M^1/M^2$ ratio to a desired value. When the heating temperature exceeds 300° C., coarsening of the particles is caused, whereby the light is not easily emitted and the dispersion stability of the particles into the solvent is reduced.

A heating time is not more specifically limited. By taking into consideration the heating temperature, as well as the amount of use of the $M^1$ salt to be mentioned later, etc., the heating time is selected to be, for example, several seconds to several hours, preferably set in a range of one minute to 60 minutes, and more preferably a range of three minutes to 30 minutes. When the reaction time is too short or too long, the intensity of the band-edge emission tends to decrease in the emission spectrum of the resultant semiconductor nanoparticles. When the reaction time is short, the doping is not progressed sufficiently, whereas when the reaction time is too long, the doping is excessively progressed. As a result, it is presumed that the ratio of the doping element deviates from the stoichiometric ratio (for example, becomes excessive), making it difficult to achieve the band-edge emission.

The input amount (amount of substance (moles)) of the salt of the doping element is preferably 0.10 times to 2 times as much as the amount of the corresponding element contained in the primary semiconductor nanoparticles. When the input amount of the salt of the doping element is extremely little, the doping is not progressed, making it difficult to change the $M^1/M^2$ ratio to the desired value. On the other hand, if the input amount of the salt of the doping element is too much, an elementary metal of the doped element may precipitate. In this case, the light emission cannot be obtained from the semiconductor nanoparticles.

Heating is preferably performed under an inert atmosphere, for example, in a nitrogen atmosphere or rare gas (especially, argon) atmosphere. If the heating is performed under an atmosphere containing oxygen or in the air, oxides are generated as impurities, or alternatively, the surface of the obtained particle is oxidized to prevent enough protection of the nanoparticles by a surface modifier, which causes inconveniences, including agglomeration of the nanoparticles. The heating is preferably performed under a pressure of 0.1 MPa or greater and 1.0 MPa or less. The heating under such a pressure is more likely to promote the doping.

The doping described above can change the $M^1/M^2$ ratio in the primary semiconductor nanoparticles, thereby producing the semiconductor nanoparticles with the composition close to the stoichiometric composition. The doping process is preferably performed such that the $M^1/M^2$ ratio after the doping process is 0.990 or greater and 1.089 or less. The semiconductor nanoparticles with such a $M^1/M^2$ ratio can produce the band-edge emission as described in the description of the above first embodiment.

When producing the semiconductor nanoparticles of the first embodiment, the primary semiconductor nanoparticles contain the elements $M^1$, $M^2$, and Z, and have an average particle size of 50 nm or less. The primary semiconductor nanoparticles may have at least one kind of crystal structure selected from a tetragonal system, a hexagonal system, and an orthorhombic system. The aggregate of the primary semiconductor nanoparticles may contain nanoparticles with different crystal structures.

The elements $M^1$, $M^2$, and Z have been described above in relation to the first embodiment. When producing the semiconductor nanoparticles of the second embodiment, the primary semiconductor nanoparticles contain the elements $M^1$, $M^2$, $M^3$, and Z, and have an average particle size of 50 nm or less. The elements $M^1$, $M^2$, $M^3$, and Z have been described above in relation to the second embodiment. The method for producing the primary semiconductor nanoparticles is not particularly limited in the production of the semiconductor nanoparticles of any embodiment. That is, the primary semiconductor nanoparticles produced by any method can change the $M^1/M^2$ ratio by the above-mentioned doping process. The $M^1/M^2$ ratio in the primary semiconductor nanoparticles is generally within a range of 0.500 or greater and less than 0.990, even though it depends on the production method.

For example, when producing the semiconductor nanoparticles of the first embodiment, the primary semiconductor nanoparticles may be produced by a method that involves mixing the salt of the element $M^1$, the salt of the element $M^2$, and the ligand with a Z element as a coordination element to thereby form a complex, and then heat-treating the complex. The $M^1$ salt and the $M^2$ salt have been described above in relation to the doping process. When Z is sulfur (S), examples of the ligand with a Z element as a coordination element include β-dithiones such as 2,4-pentanedithione; dithiols such as 1,2-bis(trifluoromethyl)ethylene-1,2-dithiol; diethyldithiocarbamate; and thiourea.

When Z is tellurium (Te), examples of the ligand with a Z element as a coordination element include diallyl telluride, and dimethyl ditelluride. When Z is selenium (Se), examples of the ligand with a Z element as a coordination element include dimethyldiselenocarbamic acid, and 2-(dimethylamino)ethaneselenol.

The complex is obtained by mixing the $M^1$ salt, the $M^2$ salt, and the ligand with a Z element as a coordination element. Formation of the complex may be achieved by mixing an aqueous solution containing the $M^1$ salt and the $M^2$ salt with an aqueous solution containing the ligand with a Z element as a coordination element, or alternatively by introducing the $M^1$ salt, $M^2$ salt, and the ligand with a Z element as a coordination element into an organic solvent (particularly, an organic solvent having high polarity, such as ethanol) and mixing them therein. The organic solvent may be the surface modifier or a solution containing the surface modifier. The preparation ratio of the $M^1$ salt, $M^2$ salt, and the ligand with a Z element as a coordination element is preferably set at 1:1:2 (as a molar ratio) that corresponds to the composition formula of $M^1M^2Z_2$.

Next, the resultant complex is subjected to a heat treatment to thereby form the primary semiconductor nanoparticles. More specifically, the heat treatment of the complex may be performed by precipitating the resultant complex to separate the complex from the solvent, followed by drying it into powder, and heating the powder, for example, at a temperature of 100° C. to 300° C. In this case, the primary semiconductor nanoparticles obtained by the heat treatment are preferably subjected to another heat treatment in a solvent which is the surface modifier, or a solvent containing a surface modifier, whereby the surfaces of the nanoparticles are modified. Alternatively, the heat treatment of the complex may be performed by heating the complex obtained in the form of the powder in a solvent which is the surface modifier or a solution containing the surface modifier, for example, at a temperature of 100° C. to 300° C. Alternatively, when forming the complex by introducing the $M^1$ salt, $M^2$ salt, and the ligand with a Z element as a coordination element into an organic solvent and mixing them therein, the salts and the ligand with a Z element as a coordination element may be introduced into the surface modifier or the solvent containing the surface modifier as an organic solvent, and then subjected to the heat treatment, thereby continuously or simultaneously performing the complex formation, the heat treatment, and the surface modification.

Furthermore, the primary semiconductor nanoparticles may be formed by introducing the $M^1$ salt, the $M^2$ salt, and a Z-source compound into an organic solvent. Alternatively, the primary semiconductor nanoparticles may be produced by a method that involves forming a complex by a reaction between the organic solvent and the $M^1$ salt; forming another complex by a reaction between the organic solvent and the $M^2$ salt; reacting these complexes with the Z-source compound to produce a reaction product; and growing crystals of the reaction product obtained. The $M^1$ salt and the $M^2$ salt are the same as described above in relation to the doping process. Examples of the organic solvent which reacts with these salts to give the complex include alkylamines, alkenylamines, alkylthiols, alkenylamines, alkylphosphines, and alkenylphosphines that have a carbon number of 4 to 20. These organic solvents finally serve to modify the surface of the obtained primary semiconductor nanoparticles. Such organic solvents may be mixed with other organic solvents in use.

Also in this production method, the preparation ratio of the $M^1$ salt, the $M^2$ salt, and Z-source compound is also preferably set at 1:1:2 (as a molar ratio) that corresponds to the composition formula of $M^1M^2Z_2$.

Examples of the Z supply-source compound are sulfur, thiourea, thioacetamide, and alkylthiol when Z is sulfur (S). When Z is tellurium (Te), a Te-phosphine complex may be used as a compound serving as a Z-source compound. The Te-phosphine complex is obtained, for example, by adding Te powder into a trialkylphosphine to obtain a mixed solution, followed by a heat treatment of the mixed solution at a temperature of 200° C. to 250° C. When Z is selenium (Se), a Se-phosphine complex may be used as a compound serving as the Z-source compound. The Se-phosphine complex is obtained, for example, by adding Se powder into a trialkylphosphine, followed by a heat treatment at a temperature of 200° C. to 250° C.

Alternatively, a method of producing the primary semiconductor nanoparticles may be the so-called hot-injection method. The hot-injection method is a method of producing semiconductor nanoparticles that involves: providing a liquid (also called a precursor solution) in which source compounds of respective elements for forming primary semiconductor nanoparticles (e.g., the $M^1$ salt, the $M^2$ salt, and a Z-source compound (or a ligand with a Z element as a coordination element)) are dissolved or dispersed, respectively; and introducing the precursor solution into a solvent heated at a temperature in a range of 100° C. to 300° C. for a relatively short time (e.g., of the order of milliseconds), thereby forming a number of crystal nuclei in an initial reaction stage. Alternatively, the hot-injection method may involve: dissolving or dispersing source compounds for some of the elements in an organic solvent beforehand, followed by heating it; and introducing a precursor solution for the remaining elements into the solution. In the case where the solvent is the surface modifier, or a solvent containing the surface modifier, the modification of the surfaces of the particles can be made simultaneously. Such a hot-injection method can give the nanoparticles with a smaller particle size.

In any of these methods, the production of the primary semiconductor nanoparticles is conducted under an inert atmosphere, particularly, under an argon atmosphere or a nitrogen atmosphere. This is to reduce or prevent the byproduction of oxides and the oxidation of the surfaces of primary semiconductor nanoparticles.

When producing the semiconductor nanoparticles of the second embodiment, the $M^3$ salt is used together with the $M^1$ salt and the $M^2$ salt in the production of the primary semiconductor nanoparticles described above. The preparation ratio of the $M^1$ salt, $M^2$ salt, $M^3$ salt, and the ligand with a Z element as a coordination element or the Z-source compound is preferably x:x:y:2 (as molar ratio) that corresponds to the composition formula of $(M^1M^2)_xM^3_yTe_2$ (where x+y=2). The $M^3$ salt may be either an organic acid salt or an inorganic acid salt. More specifically, the $M^3$ salt may be any one of a nitrate, an acetate, a sulfate, a hydrochloride, and a sulfonate. The method for producing the semiconductor nanoparticles of the second embodiment is substantially the same as the method for producing the semiconductor nanoparticles of the first embodiment in regard to points other than the above, and here a detailed description thereof will be omitted.

When substituting part of $M^2$ of the semiconductor nanoparticles by another metal element, a salt of the other metal element is used in producing the primary semiconductor nanoparticles. In this case, the preparation ratio of the $M^2$ salt and the salt of the metal element is adjusted such that the substitution rate of the metal element is set at a desired value. Likewise, when producing the semiconductor nanoparticles of the second embodiment, in order to substitute part of $M^3$ in the composition by another metal element, a salt of another metal element is used in producing the primary semiconductor nanoparticles.

In the production method according to the fourth embodiment, after ending the doping process, the resultant semiconductor nanoparticles may be separated from a liquid after process, and further refined as needed. The separation is performed, for example, by centrifuging a mixed solution after the doping process, and taking out a supernatant liquid. The refinement is performed by adding alcohol to the supernatant liquid, and then centrifuging the mixture to generate a precipitate to take out the precipitate (or removing the supernatant liquid), followed by drying the separated precipitate, for example, by vacuum deaeration or natural drying, or dissolving the precipitate in an organic solvent. The refinement (including the addition of alcohol and the centrifugation) may be performed two or more times as needed. Alcohol suitable for use in the refinement may be lower alcohols such as methanol, ethanol, and n-propanol. When dissolving the precipitate in an organic solvent, suitable organic solvents may include chloroform, toluene, cyclohexane, hexane, pentane, and octane.

The above-mentioned separation and refinement may be performed also in producing the primary semiconductor nanoparticles. When drying the refined primary semiconductor nanoparticles, the drying may be performed by vacuum deaeration, natural drying, or a combination of the vacuum deaeration and natural drying. The natural drying may be performed, for example, by leaving the particles in the atmosphere at normal temperature and pressure. In this case, the particles are allowed to stand for 20 hours or more, for example, about 30 hours.

After producing the semiconductor nanoparticles by the above-mentioned method, a coating layer may be further formed thereon. The method for forming the coating layer is disclosed in Chem, Commun. 2010, vol. 46, pp. 2082-2084, and the coating layer may be formed using the method mentioned in that document. More specifically, when forming the coating layer of ZnS, the resultant semiconductor nanoparticles are dispersed in a thiol (e.g., 1-dodecanthiol), followed by addition of zinc acetate as a zinc source and then a thioacetamide. This solution is heated under a nitrogen atmosphere, for example, at 180° C. for 30 minutes to cause reaction therebetween. A reaction product is cooled to a room temperature, and alcohol is then added to the product, followed by centrifugal separation. The resultant precipitate is dissolved in an organic solvent added, followed by centrifugal separation again to thereby remove coarse particles, thus producing a solution containing the semiconductor nanoparticles with the coating layer formed thereon. When forming the coating layer of ZnTe, instead of thioacetamide, a Te-phosphine complex, which is explained in the description of the first embodiment, is used. Alcohol suitable for use is lower alcohol such as methanol, ethanol, and n-propanol. Examples of the organic solvent for dissolving the precipitate may include chloroform, toluene, cyclohexane, hexane, pentane, and octane.

When forming the coating layer of a compound other than ZnS and ZnTe, the coating layer can be formed by the same method as described above. For example, when forming the coating layer of a Cd-containing compound, such as CdS, cadmium acetate is used as a cadmium source. When forming the coating layer of a selenium compound, Se powder is used to prepare a Se-phosphine complex solution in the same manner as that in the step (a), and the solution is used.

Fifth Embodiment

Light-Emitting Device

As a fifth embodiment, a light-emitting device will be described that uses the semiconductor nanoparticles of any of the first to the third embodiments.

The light-emitting device as the fifth embodiment is a light-emitting device including a light conversion member and a semiconductor light-emitting element, in which the light conversion member contains the semiconductor nanoparticles of any of the first to the third embodiments. In such a light-emitting device, for example, the semiconductor nanoparticles absorb part of the light emitted from the semiconductor light-emitting element, and then light of a longer wavelength is emitted. The light from the semiconductor nanoparticles and the remaining light emitted from the semiconductor light-emitting element are mixed together, and the mixed light can then be used as the light emission from the light-emitting device.

More specifically, the light-emitting device that emits white light can be obtained as a result by using an LED chip that emits blue-violet or blue light with a peak wavelength of about 400 nm to 490 nm and the semiconductor nanoparticles that absorb blue light and then emit yellow light therefrom. Alternatively, the white light-emitting device can be obtained by using two kinds of semiconductor nanoparticles, one absorbing the blue light and emitting green light and the other semiconductor nanoparticles absorbing the blue light and emitting red light.

Further, alternatively, the white light-emitting device can be obtained by using a semiconductor light-emitting element that emits ultraviolet light with a peak wavelength of 400 nm or less, and three kinds of semiconductor nanoparticles that absorb the ultraviolet light and emit blue, green, and red lights, respectively. In this case, to avoid the leak of the ultraviolet light emitted from the light-emitting element toward the outside, the whole light from the light-emitting element is desirably absorbed and converted by the semiconductor nanoparticles.

The semiconductor nanoparticles may be used in combination with other semiconductor nanoparticles, or any phosphors other than quantum dots (e.g., an organic phosphor or an inorganic phosphor). Other semiconductor nanoparticles may be, for example, binary semiconductor nanoparticles mentioned in the "Background" section. The phosphors other than quantum dots can be garnet-based phosphors, such as an aluminum garnet-based phosphor. The garnet phosphors include an yttrium-aluminum-garnet-based phosphor activated by cerium, and a lutetium-aluminum-garnet-based phosphor activated by cerium. As the phosphors other than quantum dots, a nitrogen-containing calcium aluminosilicate-based phosphor activated by europium and/or chromium; a silicate-based phosphor activated by europium; a nitride-based phosphor, such as a β-SiAlON-based phosphor, a CASN-based phosphor, and a SCASN-based phosphor; a rare earth nitride-based phosphor, such as $LnSi_3N_{11}$-based phosphor and a LnSiAlON-based phosphor; an oxynitride-based phosphor, such as a $BaSi_2O_2N_2$:Eu-based phosphor and $Ba_3Si_6O_{12}N_2$:Eu-based phosphor; a sulfide-based phosphor, such as a CaS-based phosphor, a $SrGa_2S_4$-based phosphor, a $SrAl_2O_4$-based phosphor, and a ZnS-based phosphor; a chlorosilicate-based phosphor; $SrLiAl_3N_4$:Eu phosphor; $SrMg_3SiN_4$:Eu phosphor; and $K_2SiF_6$:Mn phosphor as a fluoride complex phosphor activated by manganese may be used.

The light conversion member which contains the semiconductor nanoparticles in the light-emitting device may be, for example, a sheet or plate-shaped member. Alternatively, the light conversion member may be a sealing member of a surface mounted light-emitting diode with a semiconductor light-emitting element arranged at a bottom surface of a recess formed in a package. The sealing member is formed by charging resin into the recess to seal the light-emitting element.

Alternatively, another example of the light conversion member is a resin member, which is formed into a substantially uniform thickness to enclose upper surface and side surfaces of a semiconductor light-emitting element placed on a planar substrate.

Further, alternatively, a case may be considered where a resin member which contains reflective material is filled in a circumferential area of a semiconductor light-emitting element such that an upper end of the resin member is flush with the semiconductor light-emitting element. In this case, the light conversion member, as a further example, is a planar-shaped resin member formed into a predetermined thickness on the upper side of the semiconductor light-emitting element and the above-mentioned resin member which contains the reflective material.

The light conversion member may be in contact with the semiconductor light-emitting element, or provided away from the semiconductor light-emitting element. More specifically, the light conversion member may be a pellet-shaped member, a sheet member, a plate-shaped member, or a rod-shaped member, which is located away from the semiconductor light-emitting element. Alternatively, the light conversion member may be, a member which is provided in contact with the semiconductor light-emitting element, for example, a sealing member, a coating member (i.e., member covering the light-emitting element provided independently from the mold member), or a mold member (e.g., including a lens-shaped member).

When using two or more kinds of semiconductor nanoparticles exhibiting the light emission of different wavelengths in the light emitting device, a mixture of the two or more kinds of semiconductor nanoparticles may be contained in one light conversion member, or alternatively, a combination of two or more light conversion members, each of which contains only one kind of semiconductor nanoparticles, may be used. In this case, two or more kinds of light conversion members may be stacked to form a stacked structure, or may be arranged on the plane in a dot-like or stripe pattern.

The semiconductor light-emitting element is, for example, an LED chip. The LED chip may include a semiconductor layer made of one or more kinds of compounds selected from the group consisting of GaN, GaAs, InGaN, AlInGaP, GaP, SiC, and ZnO. The semiconductor light-emitting element that emits blue-violet light, blue light, or ultraviolet light preferably includes, as the semiconductor layer, a GaN-based compound represented by general formula: $In_xAl_yGa_{1-X-Y}N$ (0≤X, 0≤Y, X+Y<1).

The light-emitting device of this embodiment is preferably incorporated in a liquid crystal display device as a light source. Since the band-edge emission by the semiconductor nanoparticles has a short photoluminescence lifetime, the light-emitting device using such semiconductor nanoparticles is suitable for use as the light source for the liquid crystal display device requiring a relatively high response speed. The semiconductor nanoparticles of this embodiment can exhibit the emission peak with a smaller full width at half maximum as the band-edge emission. Thus, the liquid crystal display device that exhibits excellent color reproducibility can be obtained without using a dense color filter, if, in the light-emitting device, the blue semiconductor light-emitting element is adapted to produce the blue light with a peak wavelength of 420 nm to 490 nm, while the semiconductor nanoparticles are adapted to produce the green light with a peak wavelength of 510 nm to 550 nm and preferably 530 nm to 540 nm as well as the red light with a peak wavelength of 600 nm to 680 nm and preferably 630 nm to 650 nm; or if, in the light-emitting device, the semiconductor light-emitting element is adapted to produce the ultraviolet light with a peak wavelength of 400 nm or less, while the tellurium compound nanoparticles are adapted to produce the blue light with a peak wavelength of 430 nm to 470 nm and preferably 440 nm to 460 nm, the green light with a peak wavelength of 510 nm to 550 nm and preferably 530 nm to 540 nm, and the red light with a peak wavelength of 600 nm to 680 nm and preferably 630 to 650 nm. The light-emitting device of this embodiment is used, for example, as a direct-lit backlight or an edge-lit backlight.

Alternatively, a sheet, a plate-shaped member, or a rod made of resin, glass, or the like containing the semiconductor nanoparticles of any of the first to the third embodiments may be incorporated as a light conversion member which is independent of the light-emitting device, into a liquid crystal display device.

EXAMPLES

Experiment 1

(1) Production of Primary Semiconductor Nanoparticles

First, 0.1 mmol of each of silver acetate (AgOAc) and indium acetate (In(OAc)$_3$), 0.2 mmol of thiourea, and 0.05 cm$^3$ of 1-dodecanethiol were measured and introduced into a test tube, to which oleylamine was added in the test tube such that the total amount of the contents in the test tube was 3.0 cm$^3$. The contents in the test tube were heated at 250° C. for 10 minutes while being stirred under a nitrogen atmosphere. The obtained suspension was centrifuged (with radius of 144 mm at the rate of 4000 rpm), and a supernatant liquid was taken out. The supernatant liquid was filtered by using a syringe with a membrane filter attached to its tip end. Then, methanol was added to the filtered supernatant liquid, followed by centrifugal separation (with radius of 144 mm at the rate of 4000 rpm). Subsequently, the precipitate was dried at the normal temperature by vacuum deaeration, thereby producing the semiconductor nanoparticles (primary semiconductor nanoparticles).

Figure 9:
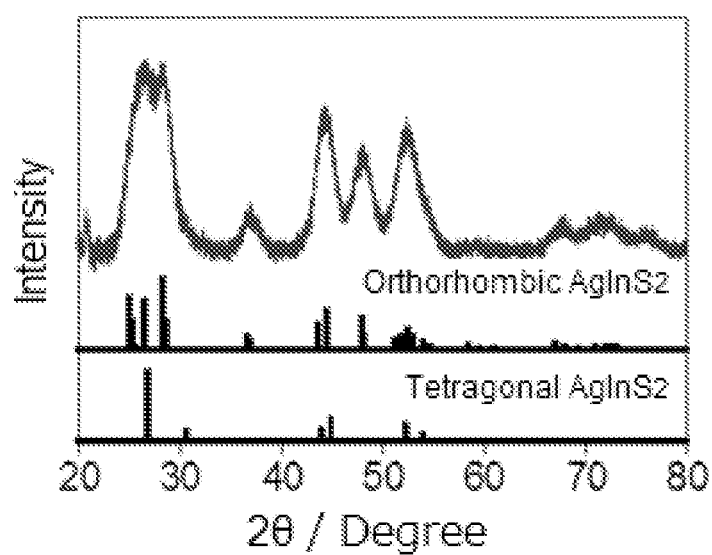
FIG. 9 shows an XRD pattern of primary semiconductor nanoparticles produced in Experiment 1.

An XRD pattern of the resultant primary semiconductor nanoparticles was measured and compared with an XRD pattern of AgInS$_2$ having a tetragonal system (of a chalcopyrite type), an XRD pattern of AgInS$_2$ having a hexagonal system (of a wurtzite type), and an XRD pattern of AgInS$_2$ having an orthorhombic system. The measured XRD pattern is shown in FIG. 9. The XRD pattern showed that the crystal structure of the primary semiconductor nanoparticles is the orthorhombic system or a mixture of the orthorhombic system and the tetragonal system. The XRD pattern was measured using a powder X-ray diffractometer manufactured by RIGAKU Corporation (trade name: SmartLab) (the same goes for the following experiments).

The shapes of the resultant primary semiconductor nanoparticles were observed by using a transmission electron microscope (TEM, manufactured by HITACHI HIGH-TECHNOLOGIES Corporation, Trade name: H-7650), and the average particle size was measured on TEM images at a magnification of 68,000. Here, a commercially-available copper grid with an elastic carbon supporting film (provided by OKENSHOJI Co., Ltd.) was used as a TEM grid. The shape of the obtained particle was spherical or polygonal.

Regarding all measurable nanoparticles included in the TEM image, that is, all nanoparticles except for the ones whose parts were cut at the side edges of the image, the particle sizes of all these particles were measured and averaged to thereby determine an arithmetic average particle size of the nanoparticles. When the number of measurable nanoparticles in total is less than 100 on one TEM image, another TEM image was taken, and particle sizes of the particles included in the other TEM image were measured to determine the arithmetic average particle size of 100 or greater particles in total.

The average particle size of the primary semiconductor nanoparticles was 5.7 nm.

Furthermore, regarding the obtained primary semiconductor nanoparticles, a ratio of the number of atoms of Ag corresponding to M$^1$ to that of In corresponding to M$^2$ was determined by an X-ray fluorescence spectrometer (trade name: EDXL300, manufactured by RIGAKU Corporation) and determined to be 0.895.

The measurement of the M$^1$/M$^2$ ratio using the X-ray fluorescence spectrometer was performed more specifically in the following way (the same goes for the experiments below).

An Ag and an In standard solutions were respectively diluted with 1 mol·dm$^{-3}$ nitric acid solution to obtain solutions of which concentration were 0.0, 2.0, 10, 50, and 100 ppm, respectively. Respective X-ray intensities of Ag and In were measured in the solutions of the respective concentrations by the X-ray fluorescence spectrometer (manufactured by RIGAKU Corporation, trade name: EDXL300), and calibration curves for them were made by linear approximation. The semiconductor nanoparticles were dried under reduced pressure to remove the solvent therefrom, and concentrated nitric acid was added to the dried semiconductor nanoparticles. In this way, a sample was dissolved, followed by dilution with pure water such that a nitrate ion concentration was 1 mol·dm$^{-3}$. In the same way as mentioned above, the sample solution was subjected to the X-ray fluorescence analysis, and the obtained signal intensities were converted into the concentrations by using the above-mentioned calibration curves, thereby determining the concentration of Ag (M$^1$) and the concentration of In (M$^2$). Using this result, the ratio of the number of atoms of the M$^1$ element to that of the M$^2$ element in the nanoparticles was determined.

(2) Production of Semiconductor Nanoparticles by Varying Ratio M$^1$/M$^2$

The semiconductor nanoparticles obtained in the above step (1) (the number of particles of 2.0×10$^{-5}$ mmol, Ag content of 2.0×10$^{-2}$ mmol), silver acetate (AgOAc) in the following amounts, 2.95 cm$^3$ of oleylamine, and 0.05 cm$^3$ of 1-dodecanethiol were put in a test tube, and heated and stirred at 250° C. for 8 minutes under the nitrogen atmosphere. The solution obtained after the heating was centrifuged (with radius of 144 mm at a rate of 4,000 rpm) to take out the supernatant liquid, followed by addition of methanol thereto, forming a precipitate. The precipitate was dried by the vacuum deaeration at the normal temperature, whereby the target semiconductor nanoparticles were obtained.

Amount of Silver Nitrate Used

Sample 1-1: 0.5×10$^{-2}$ mmol (0.25 times as much as the Ag content)
Sample 1-2: 1.0×10$^{-2}$ mmol (0.5 times as much as the Ag content)
Sample 1-3: 2.0×10$^{-2}$ mmol (as much as the Ag content)
Sample 1-4: 10.0×10$^{-2}$ mmol (5 times as much as the Ag content)

The semiconductor nanoparticles of sample Nos. 1-1 to 1-4 were analyzed by means of the X-ray fluorescence spectrometer, whereby the number of atoms of Ag/the number of atoms of In were determined as mentioned below.
Sample 1-1: 0.984
Sample 1-2: 0.990
Sample 1-3: 0.995
Sample 1-4: –(Unmeasurable)

The semiconductor nanoparticles of sample Nos. 1-1 to 1-4 were dispersed in chloroform, and the absorption and emission spectrum thereof were measured. The results are shown in FIGS. 1 to 4 in this order. The absorption spectrum was measured in a wavelength range from 190 nm to 1100 nm by using a diode-array spectrophotometer (manufactured by AGILENT TECHNOLOGIES, Inc., trade name: Agilent 8453A). The emission spectrum was measured at an excitation wavelength of 365 nm by using a multi-channel spectrometer (manufactured by HAMAMATSU PHOTONICS K.K., trade name: PMA11). The emission spectra of the sample 1-2 (see FIG. 2) and the sample 1-3 (see FIG. 3) were observed to have sharp emission peaks with a full width at half maximum of about 30 nm and about 36 nm, respectively, at a wavelength of about 588 nm.

As can be seen from these results, the emission peaks observed in the emission spectra of the sample 1-2 and sample 1-3 were confirmed to be the band-edge emission.

The measured XRD pattern of each of the sample 1-2 and sample 1-3 did not differ from that of the primary semiconductor nanoparticles. It was confirmed from the TEM image that each of the sample 1-2 and sample 1-3 did not substantially differ in the shape and particle size from the primary semiconductor nanoparticles.

Figure 5:
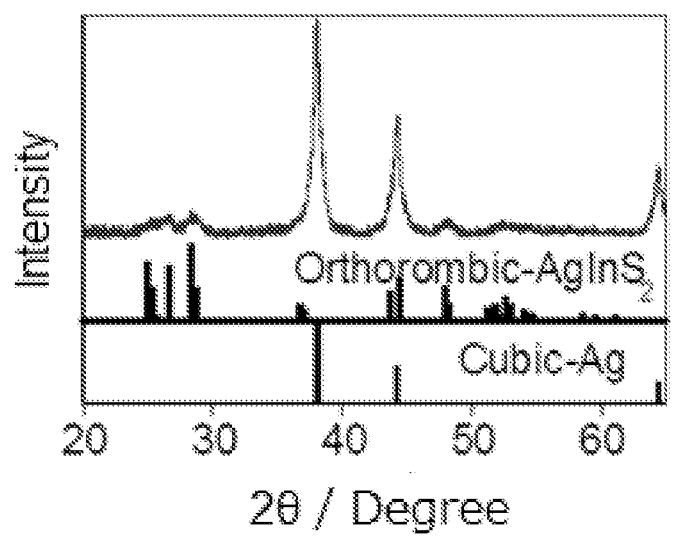
FIG. 5 shows an X-ray diffraction (XRD) pattern of Sample 1-4 obtained in Experiment 1.

On the other hand, in the emission spectrum of the sample 1-1, the relatively broad emission alone was observed, and no band-edge emission was recognized. The sample 1-4 did not produce the emission itself. Then, the XRD pattern of the sample 1-4 was measured, whereby the pattern shown in FIG. 5 was obtained. It was confirmed that this corresponds to the XRD pattern of silver with the cubic system. That is, in the sample 1-4, the metallic silver was generated.

Experiment 2

The primary semiconductor nanoparticles were produced in the same way as in Experiment 1. These primary semiconductor nanoparticles were subjected to the doping process, in the same manner as in Experiment 1. The doping process was performed for each sample by setting the amount of silver acetate used at $1.0 \times 10^{-2}$ mmol and by changing the heating time as follows.
Heating Time
Sample 2-1: 4 minutes
Sample 2-2: 8 minutes
Sample 2-3: 15 minutes The semiconductor nanoparticles of samples 2-1 to 2-3 were analyzed by means of the X-ray fluorescence spectrometer, whereby the number of atoms of Ag/the number of atoms of In were determined. The results are shown below.
Sample 2-1: 1.050
Sample 2-2: 0.990
Sample 2-3: 1.089

Figure 6:
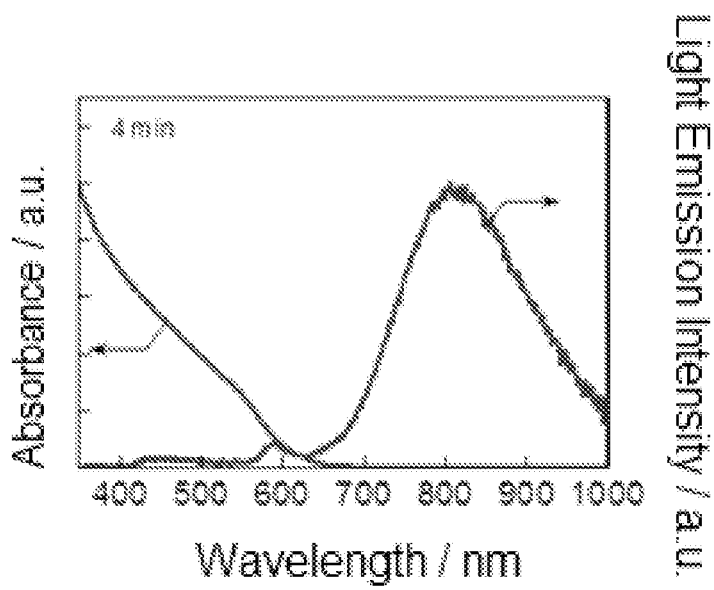
FIG. 6 shows absorption and emission spectra of Sample 2-1 obtained in Experiment 2.
Figure 7:
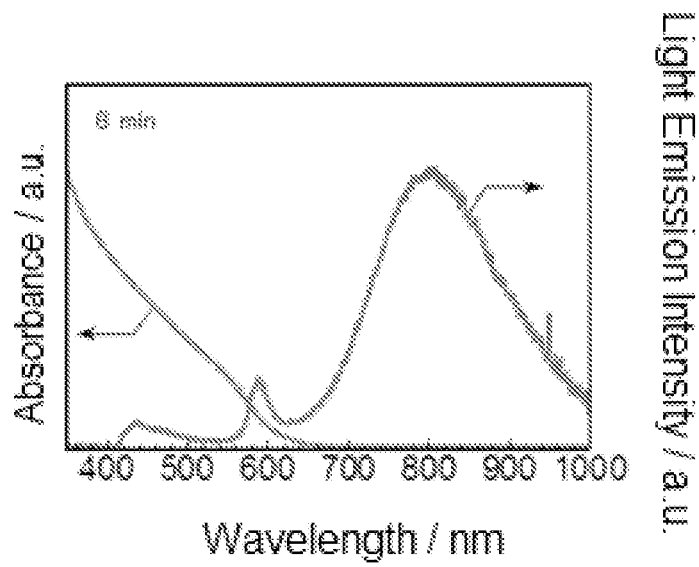
FIG. 7 shows absorption and emission spectra of Sample 2-2 obtained in Experiment 2.
Figure 8:
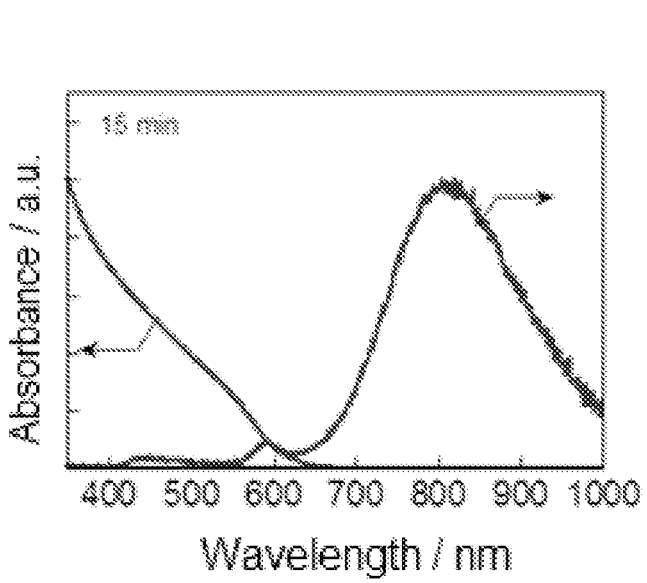
FIG. 8 shows absorption and emission spectra of Sample 2-3 obtained in Experiment 2.

The absorption and emission spectrums of the semiconductor nanoparticles in samples 2-1 to 2-3 were measured using the same device as that used in Experiment 1. The results are shown in FIGS. 6 to 8 in this order. The sample 2-2 is the same as the above-mentioned sample 1-2. The emission spectrum was measured at an excitation wavelength of 365 nm. In any of these samples, the emission peak was recognized at a wavelength of about 588 nm to 590 nm. From the results shown above, in each sample, the emission peak observed at a wavelength of about 588 nm to 590 nm was confirmed to be the band-edge emission. The measured XRD pattern of each of the samples 2-1 to 2-3 did not differ from that of the primary semiconductor nanoparticles. It was confirmed from the TEM image that each of the samples 2-1 to 2-3 did not substantially differ in the shape and particle size from the primary semiconductor nanoparticles.

Experiment 3

(1) Production of Primary Semiconductor Nanoparticles

Primary semiconductor nanoparticles were produced in the same way as Experiment 1 except that the amount of 1-dodecanethiol was changed and a sample was left under normal temperature and pressure after vacuum deaeration. First, 0.1 mmol of each of silver acetate (AgOAc) and indium acetate (In(OAc)$_3$), 0.2 mmol of thiourea, and 0.15 cm$^3$ of 1-dodecanethiol were measured and introduced into a test tube, to which oleylamine was added such that the total amount of the contents in the test tube was 3.0 cm$^3$. The contents in the test tube were heated at 250° C. for 10 minutes while being stirred under a nitrogen atmosphere. The obtained suspension was centrifuged (with radius of 170 mm at the rate of 2400 rpm), and a supernatant liquid was taken out. The supernatant liquid was filtered by using a syringe with a membrane filter attached at its tip end. Then, methanol was added to the filtered supernatant liquid, followed by centrifugal separation (with radius of 170 mm at the rate of 2400 rpm). Then, a precipitate was dried, thereby producing the semiconductor nanoparticles (primary semiconductor nanoparticles). The precipitate was dried by the vacuum deaeration for 6 hours, and further allowed to stand for 30 hours under normal temperature and pressure. The average particle size of the obtained primary semiconductor nanoparticles was 3.5 nm.

(2) Production of Semiconductor Nanoparticles by Varying Ratio $M^1/M^2$

The semiconductor nanoparticles obtained in the above step (1) (the number of particles of $1.56 \times 10^{-5}$ mmol, and Ag content of $1.56 \times 10^{-2}$ mmol), $0.78 \times 10^{-2}$ mmol of silver acetate (AgOAc) (0.5 time as much as the Ag content mentioned above), 2.95 cm$^3$ of oleylamine, and 0.05 cm$^3$ of 1-dodecanethiol were put in a test tube and heated and stirred at 250° C. for 8 minutes under a nitrogen atmosphere. The solution obtained after the heating was centrifuged (with radius of 170 mm at a rate of 2400 rpm) to take out the supernatant liquid, followed by addition of methanol thereto, forming a precipitate. The precipitate was dried by the vacuum deaeration at the normal temperature, whereby the target semiconductor nanoparticles were obtained.

Figure 10:
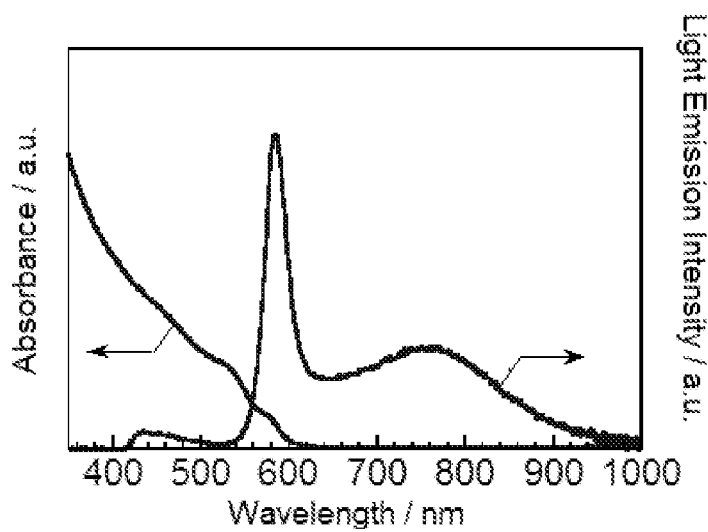
FIG. 10 shows absorption and emission spectra of semiconductor nanoparticles produced in Experiment 3.
Figure 11:
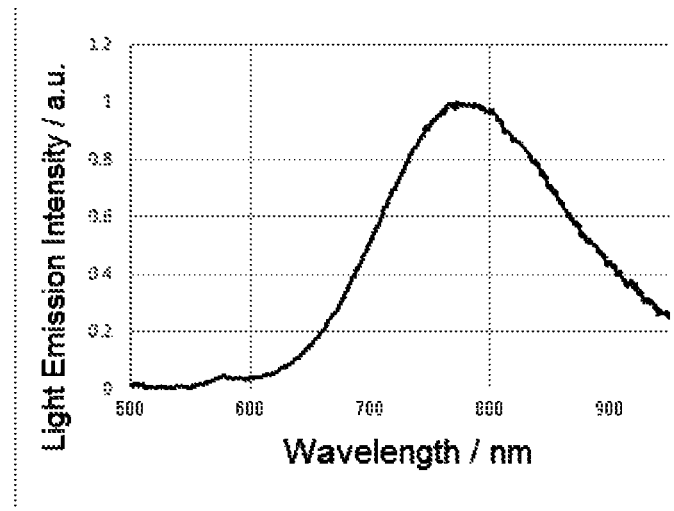
FIG. 11 shows an emission spectrum of primary semiconductor nanoparticles produced in Experiment 3.

The absorption and emission spectrums of the semiconductor nanoparticles obtained were measured using the same devices as those used in Experiment 1. These results are shown in FIG. 10 below. The emission spectrum of the primary semiconductor nanoparticles are also shown in FIG. 11. The primary semiconductor nanoparticles were dispersed in chloroform, and the emission spectrum of the primary semiconductor nanoparticles in the solution were measured at an excitation wavelength of 365 nm using a quantum efficiency measurement system (manufactured by OTSUKA ELECTRONICS Co., Ltd, trade name: QE-2100). As shown in FIG. 11, the primary semiconductor nanoparticles were hardly observed to produce the band-edge emission, whereas as shown in FIG. 10, the emission spectrum of the obtained semiconductor nanoparticles was observed to exhibit a sharp emission peak with a full width at half maximum of about 32 nm at a wavelength of around 586 nm. The fluorescence lifetime of the emission observed as the emission peak was measured to be 55.3 ns. Note that the photoluminescence lifetime was measured by using a small-sized photoluminescence lifetime spectrometer "Quantaurus-Tau (C11367-01)", manufactured by HAMAMATSU PHOTONICS K.K. From these results, the semiconductor nanoparticles obtained in this experiment were confirmed to produce the band-edge emission. The absorption spectrum of the obtained semiconductor nanoparticles was observed to have the peak supposed as the exciton peak at a wavelength of around 540 nm.

The embodiments of the present disclosure provide the semiconductor nanoparticles capable of band-edge emission, which can be used as a wavelength conversion material of light-emitting devices or as biomolecule markers.

While some embodiments according to the present disclosure have been exemplified above, it is apparent that the present disclosure is not limited to the above-mentioned embodiments and can have any form without departing from the scope of the present disclosure.

What is claimed is:

1. A method of producing semiconductor nanoparticles, the method comprising:
heating primary semiconductor nanoparticles and a salt of an element $M^1$ in a solvent at a temperature set in a range of 100° C. to 300° C., wherein
the primary semiconductor nanoparticles contain the element $M^1$, an element $M^2$, optionally an element $M^3$, and an element Z, and have an average particle size of 50 nm or less, wherein
the element $M^1$ is at least one element selected from the group consisting of Ag, Cu, and Au,
the element $M^2$ is at least one element selected from the group consisting of Al, Ga, In, and Tl,
the element $M^3$ is at least one element selected from the group consisting of Zn and Cd, and
the element Z is at least one element selected from the group consisting of S, Se, and Te.

2. The method of producing semiconductor nanoparticles according to claim 1, wherein the heating increases a ratio ($M^1/M^2$) of the number of atoms of the element $M^1$ to the number of atoms of the element $M^2$ in the primary semiconductor nanoparticles.

3. The method of producing semiconductor nanoparticles according to claim 2, wherein the ratio of the number of atoms of the element $M^1$ to the number of atoms of the element $M^2$ in the primary semiconductor nanoparticles is 0.500 or greater and less than 0.990, while the ratio of the number of atoms of the element $M^1$ to the number of atoms of the element $M^2$ in a resultant semiconductor nanoparticles is 0.990 or greater and 1.089 or less.

4. The method of producing semiconductor nanoparticles according to claim 1, wherein the salt of the element $M^1$ is an organic acid salt.

5. The method of producing semiconductor nanoparticles according to claim 1, further comprising producing the primary semiconductor nanoparticles.

6. The method of producing semiconductor nanoparticles according to claim 1, wherein the solvent is a surface modifier or a solution containing a surface modifier.

7. The method of producing semiconductor nanoparticles according to claim 1, wherein the primary semiconductor nanoparticles have at least one crystal structure selected from the group consisting of a tetragonal system, a hexagonal system, and an orthorhombic system.

8. The method of producing semiconductor nanoparticles according to claim 1, wherein the solvent is at least one solvent selected from an amine having a hydrocarbon group with 4 to 20 carbon atoms and a thiol having a hydrocarbon group with 4 to 20 carbon atoms.

9. The method of producing semiconductor nanoparticles according to claim 1, wherein the solvent is a mixed solvent of an amine having a hydrocarbon group with 4 to 20 carbon atoms and a thiol with a hydrocarbon group with 4 to 20 carbon atoms.

10. The method of producing semiconductor nanoparticles according to claim 1, wherein the heating is performed under a pressure of 0.1 MPa or greater and 1.0 MPa or less.

11. A method of producing semiconductor nanoparticles, the method comprising:
heating primary semiconductor nanoparticles and a salt of an element $M^2$ in a solvent at a temperature set in a range of 100° C. to 300° C., wherein
the primary semiconductor nanoparticles contain an element $M^1$, the element $M^2$, optionally an element $M^3$, and an element Z, and have an average particle size of 50 nm or less, wherein
the element $M^1$ is at least one element selected from the group consisting of Ag, Cu, and Au,
the element $M^2$ is at least one element selected from the group consisting of Al, Ga, In, and Tl,
the element $M^3$ is at least one element selected from the group consisting of Zn and Cd, and
the element Z is at least one element selected from the group consisting of S, Se, and Te.

12. The method of producing semiconductor nanoparticles according to claim 11, wherein the heating decreases a ratio ($M^1/M^2$) of the number of atoms of the element $M^1$ to the number of atoms of the element $M^2$ in the primary semiconductor nanoparticles.

13. The method of producing semiconductor nanoparticles according to claim 11, wherein the salt of the element $M^2$ is an organic acid salt.

14. The method of producing semiconductor nanoparticles according to claim 11, further comprising producing the primary semiconductor nanoparticles.

15. The method of producing semiconductor nanoparticles according to claim 11, wherein the solvent is a surface modifier or a solution containing a surface modifier.

16. The method of producing semiconductor nanoparticles according to claim 11, wherein the primary semiconductor nanoparticles have at least one crystal structure selected from the group consisting of a tetragonal system, a hexagonal system, and an orthorhombic system.

17. The method of producing semiconductor nanoparticles according to claim 11, wherein the solvent is at least one solvent selected from an amine having a hydrocarbon group with 4 to 20 carbon atoms and a thiol having a hydrocarbon group with 4 to 20 carbon atoms.

18. The method of producing semiconductor nanoparticles according to claim 11, wherein the solvent is a mixed solvent of an amine having a hydrocarbon group with 4 to 20 carbon atoms and a thiol with a hydrocarbon group with 4 to 20 carbon atoms.

19. The method of producing semiconductor nanoparticles according to claim 11, wherein the heating is performed under a pressure of 0.1 MPa or greater and 1.0 MPa or less.

* * * * *